(12) United States Patent
Oh

(10) Patent No.: US 7,790,582 B2
(45) Date of Patent: Sep. 7, 2010

(54) METHOD FOR FABRICATING POLYSILICON LIQUID CRYSTAL DISPLAY DEVICE

(75) Inventor: Kum-Mi Oh, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/798,474

(22) Filed: May 14, 2007

(65) Prior Publication Data

US 2007/0218576 A1 Sep. 20, 2007

Related U.S. Application Data

(62) Division of application No. 11/002,649, filed on Dec. 3, 2004, now Pat. No. 7,235,416.

(30) Foreign Application Priority Data

Dec. 29, 2003 (KR) ...................... 10-2003-0099326

(51) Int. Cl.
 *H01L 21/02* (2006.01)
(52) U.S. Cl. .................... 438/482; 438/365; 257/52; 257/E23.122; 257/E29.289
(58) Field of Classification Search ................. 438/482, 438/766, 96, 365; 257/52, E21.412, E29.092, 257/E29.289, E29.297, E31.094, E33.004, 257/53, 60, E23.122, E29.08, E31.034, E31.047, 257/E31.062

See application file for complete search history.

(56) References Cited

U.S. PATENT DOCUMENTS

| | | | | |
|---|---|---|---|---|
| 5,953,595 A | * | 9/1999 | Gosain et al. | 438/158 |
| 6,455,874 B1 | * | 9/2002 | Park et al. | 257/61 |
| 6,537,864 B1 | * | 3/2003 | Aya et al. | 438/166 |
| 2002/0054247 A1 | * | 5/2002 | Hwang et al. | 349/43 |
| 2002/0086469 A1 | * | 7/2002 | Kim et al. | 438/166 |
| 2003/0193052 A1 | * | 10/2003 | Nakazawa et al. | 257/66 |
| 2005/0085099 A1 | * | 4/2005 | Gosain et al. | 438/795 |

* cited by examiner

*Primary Examiner*—David Vu
*Assistant Examiner*—Suberr Chi
(74) *Attorney, Agent, or Firm*—McKenna Long & Aldridge LLP

(57) ABSTRACT

A method for fabricating a polysilicon liquid crystal display device includes: forming a first amorphous silicon layer on a substrate; forming a photoresist pattern on the first amorphous silicon layer; forming a second amorphous silicon layer over the photoresist pattern and the first amorphous silicon layer; defining a channel region on the first amorphous silicon layer; crystallizing the first and second silicon layers; forming an active layer by patterning the crystallized silicon layers; forming a first insulating layer on the active layer; forming a gate electrode on the first insulating layer; forming source and drain electrodes electrically connected to the active layer; and forming a pixel electrode electrically connected to the drain electrode.

4 Claims, 8 Drawing Sheets

METHOD FOR FABRICATING POLYSILICON LIQUID CRYSTAL DISPLAY DEVICE

This application is a divisional of prior U.S. application Ser. No. 11/002,649, filed Dec. 3, 2004 now U.S. Pat. No. 7,235,416.

The present invention claims the benefit of Korean Patent Application No. 2003-99326 filed in Korea on Dec. 29, 2003, which is hereby incorporated by reference.

BACKGROUND OF THE INVENTION

1. Field of the Invention

The present invention relates to a liquid crystal display device, and more particularly, to a method for fabricating a polysilicon liquid crystal display device. Although the present invention is suitable for a wide scope of applications, it is particularly suited for reducing the number of processes fabricating a liquid crystal display (LCD) device.

2. Description of the Related Art

As interest in image display devices and demand for portable information device increase, a thin film type Flat Panel Display (FPD) devices have been developed that are replacing traditional Cathode Ray Tubes (CRT) type display devices. In particular, a liquid crystal display (LCD) device having the characteristic of optical anisotropy has replaced the CRT. Further, the liquid crystal display device has been used in notebook computers, desktop monitors, or the like because it has an excellent resolution, color rendering capability and picture quality.

A liquid crystal display device includes a color filter substrate, an array substrate and a liquid crystal material formed between the two substrates. A thin film transistor, which uses amorphous silicon or polycrystalline silicon as a channel layer, is used as a switching device of the liquid crystal display device. A process for fabricating the liquid crystal display device usually requires a plurality of photo-mask processes in fabricating the array substrate including the thin film transistor.

FIG. 1 is a plan view showing a unit pixel of an array substrate of a liquid crystal display device of the related art. In a typical liquid crystal display device, the 'N' number of gate lines and the 'M' number of data lines cross each other, forming the 'N×M' number of pixels. For the purpose of simplicity, only one pixel is presented in the FIG. 1. As shown in FIG. 1, the array substrate 10 includes: a pixel electrode 18 formed on a pixel region; gate lines 16 and data lines 17 disposed vertically and horizontally on the substrate 10; and a thin film transistor used as a switching device, which is formed at a region adjacent to where the gates lines 16 and the data lines 17 cross each other.

The thin film transistor includes: a gate electrode 21 connected to the gate line 16; a source electrode 22 connected to the data line 17; and a drain electrode 23 connected to the pixel electrode 18. Also, the thin film transistor includes: a first insulating layer (not shown) and a second insulating layer (not shown) for insulating the gate electrode 21 and source/drain electrodes 22 and 23; and an active layer 24 for forming a conductive channel between the source electrode 22 and the drain electrode 23 by a gate voltage supplied to the gate electrode 21. The source electrode 22 is electrically connected to a source region of the active layer 24 and the drain electrode 23 is electrically connected to a drain region of the active layer 24 through first contact holes 40a formed in the first and second insulating layers. Since a third insulating layer (not shown) has a second contact hole 40b exposing the drain electrode 23, the drain electrode 23 and the pixel electrode 18 are electrically connected to each other through the second contact hole 40b.

FIGS. 2A to 2G are views showing fabrication processes along the line I-I of the liquid crystal display device shown in FIG. 1 showing fabrication processes according to the related art. As shown in FIG. 2A, the active layer 24 of polysilcon is formed on a transparent substrate 10, such as a glass, by using photolithography.

Next, as shown in FIG. 2B, a first insulating layer 15a is formed over the active layer 24, and a conductive layer 30 is formed on the first insulating layer to form a gate electrode.

Next, as shown in FIG. 2C, a gate electrode 21 is formed on the active layer 24 with the first insulating layer 15a interposed therebetween by patterning the conductive layer 30 using a photolithography process. Thereafter, source/drain regions are formed by injecting N+ or P+ type high density impurity ions into side regions of the active layer 24 using the gate electrode 21 as a mask. The source/drain regions are formed for ohmic contacts to the source/drain electrodes.

Next, as shown in FIG. 2D, after a second insulating layer 15b as an interlayer insulating layer is deposited over the entire surface of the substrate 10 on which the gate electrode 21 is formed, the first contact holes 40a for electrical connection between the source/drain regions and the source/drain electrodes are formed by removing parts of the first insulating layer 15a and the second insulating layer 15b through photolithography.

Thereafter, as shown in FIG. 2E, after a conductive material is deposited over the entire surface of the substrate 10, the source electrode 22 connected to the source region 24S and the drain electrode 23 connected to the drain region 24d are formed through the first contact holes 40a. At this time, a part of the conductive material constructing the source electrode 22 is extended to form the data line.

Next, as shown in FIG. 2F, after the third insulating layer 15c, an organic insulating layer, such as Acryl, is deposited over an entire surface of the substrate 10, a second contact hole 40b is formed to expose the drain electrode 23 by photolithography.

Finally, after transparent conductive materials, such as Indium Tin Oxide (ITO), are deposited over the entire surface of the substrate 10 on which the third insulating layer 15c is formed. The pixel electrode 18 is connected to the drain electrode 23 through the second contact hole 40b an patterned by photolithography.

A process for injecting impurity ions into the active layer to form source and drain regions and a process for activating the impurity ions are required in the related art processes for fabricating the TFT. In order to perform these processes, special equipment is required, which leads to increase fabrication costs in fabricating a thin film transistor. In addition, photolithography processes include a plurality of sub-processes such as photoresist coating, exposure, development and etching etc. As a result, a plurality of photolithography processes lowers production yield and are prone to cause defects in the thin film transistor. Further, since a mask used in the photolithography is very expensive, if many masks are used for the processes, fabrication costs for the liquid crystal display device are also raised.

SUMMARY OF THE INVENTION

Accordingly, the present invention is directed to a method for fabricating a polysilicon liquid crystal display device that substantially obviates one or more of the problems due to limitations and disadvantages of the related art.

An object of the present invention is to fabricate a liquid crystal display device with a smaller number of masks for fabricating a polysilicon liquid crystal display device without a separate ion-injection process for forming source and drain regions on an active layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a method for fabricating a polysilicon liquid crystal display device includes: forming a first amorphous silicon layer on a substrate; forming a photoresist pattern on the first amorphous silicon layer; forming a second amorphous silicon layer over the photoresist pattern and the first amorphous silicon layer; defining a channel region on the first amorphous silicon layer; crystallizing the first and second silicon layers; forming an active layer by patterning the crystallized silicon layers; forming a first insulating layer on the active layer; forming a gate electrode on the first insulating layer; forming source and drain electrodes electrically connected to the active layer; and forming a pixel electrode electrically connected to the drain electrode.

In another aspect, a method of fabricating a polysilicon liquid crystal display device includes: forming a gate electrode on a substrate; forming a first insulating layer on the gate electrode; forming a first amorphous silicon layer on the first insulating layer; forming a photoresist pattern on the first amorphous silicon layer; forming a second amorphous silicon layer over the photoresist pattern and the first amorphous silicon layer; defining a channel region on the first amorphous silicon layer; crystallizing the first and second amorphous silicon layers; defining an active layer; forming source and drain electrodes on the crystallized second silicon layers; and forming a pixel electrode electrically connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

A polysilicon liquid crystal display device has rapid operation characteristics because of high electron mobility characteristics of polysilicon. Since polysilicon is not a complete conductive material, such as metal, and has high ohmic resistance when in contact with metal, a process of improving ohmic characteristics with a metal layer includes injecting P+ or N+ type high density impurity ions into a polysilicon layer when a source electrode or a drain electrode is in contact with the polysilicon layer. However, this process requires a separate ion-injection process and an activation process of activating the injected ions by heat-processing the polysilicon layer to activate and stabilize the crystalline lattice of the polysilicon layer since the polysilicon layer into which the ions are injected is damaged by the injected ions.

To get rid of the activation process, a first amorphous silicon layer is formed followed by a photoresist pattern being formed on the amorphous silicon layer and then a second amorphous silicon layer is formed on the photoresist pattern. When forming the second amorphous silicon layer, high density impurity ions are injected into the second amorphous silicon layer while it is being formed so that the second amorphous silicon layer will include the impurities.

Next, a lift-off process is performed on the first and second amorphous silicon layers having a photoresist pattern interposed therebetween to remove the photoresist pattern and a portion of the second amorphous silicon layer formed on the photoresist pattern, so that a channel region is defined. Then, the first and the second amorphous silicon layers are crystallized. In the crystallization process, activation of the high density impurities included in the second amorphous silicon layer and crystallization of the first and second silicon layers are performed at the same time. In embodiments of the present invention, a polysilicon liquid crystal display device is fabricated using the above-described method.

Figure 1:
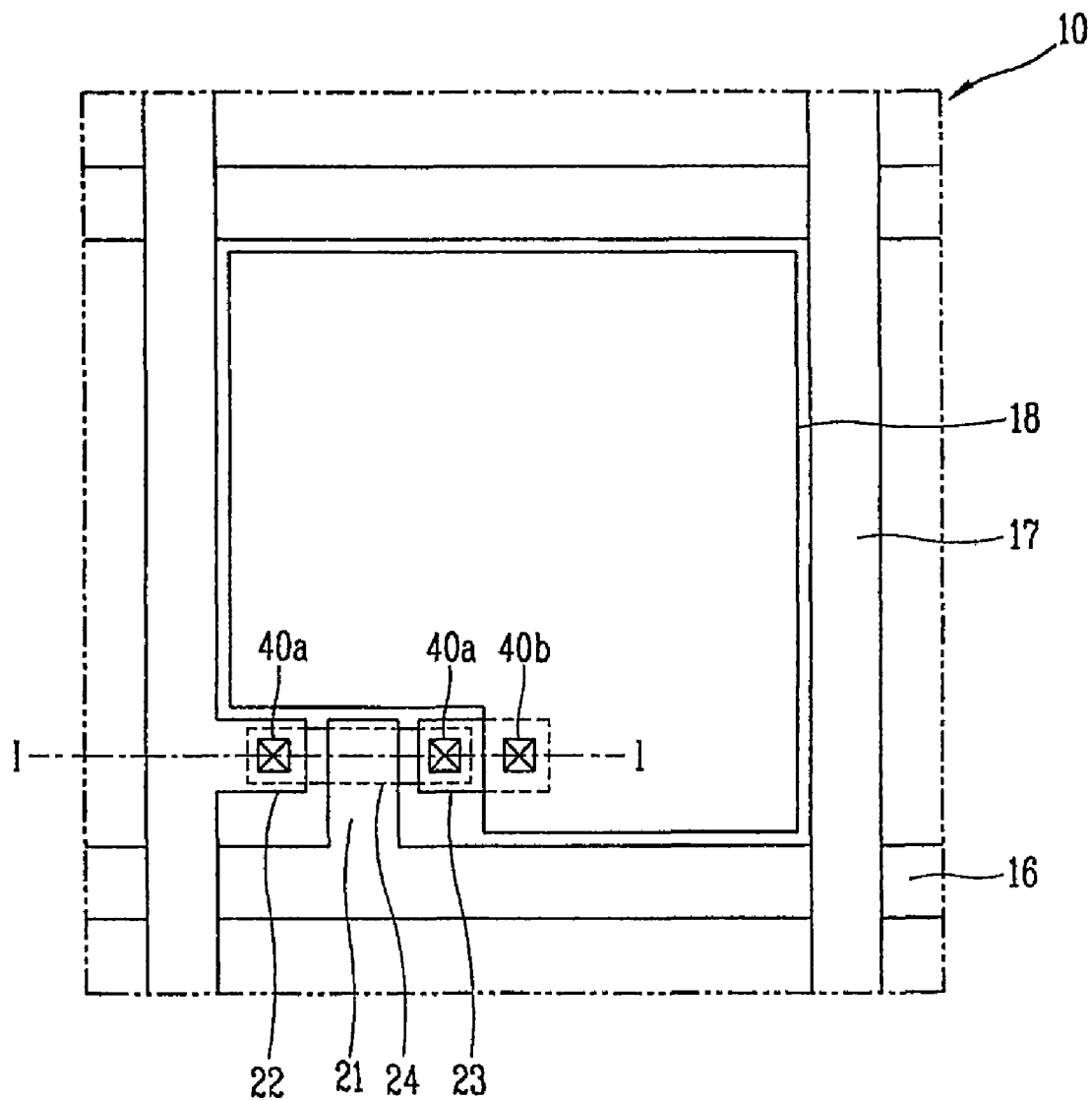
FIG. 1 is a plan view showing a part of the related art polysilicon liquid crystal display device.
Figure 2A:
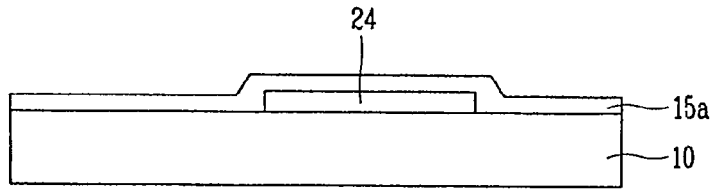
FIGS. 2A to 2G are cross-sectional views along the line I-I of FIG. 1 showing fabrication processes according to the related art.
Figure 2B:
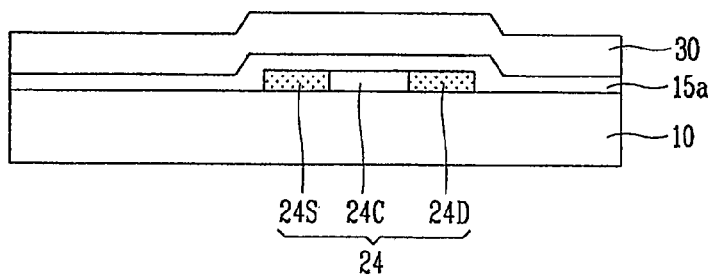
Figure 2C:
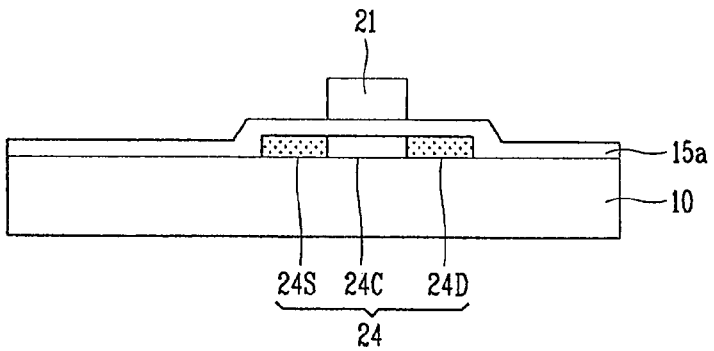
Figure 2D:
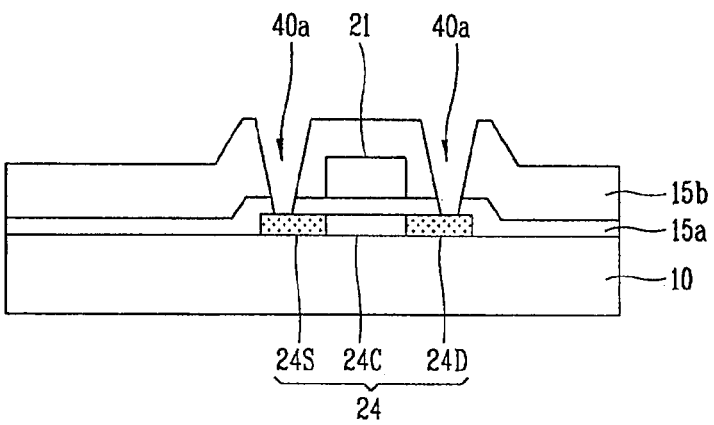
Figure 2E:
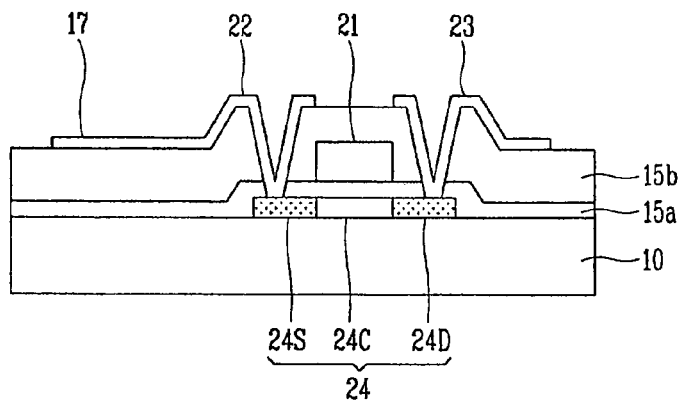
Figure 2F:
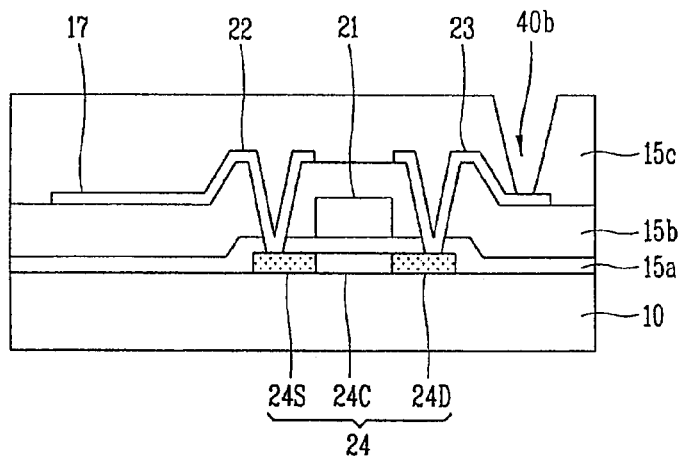
Figure 2G:
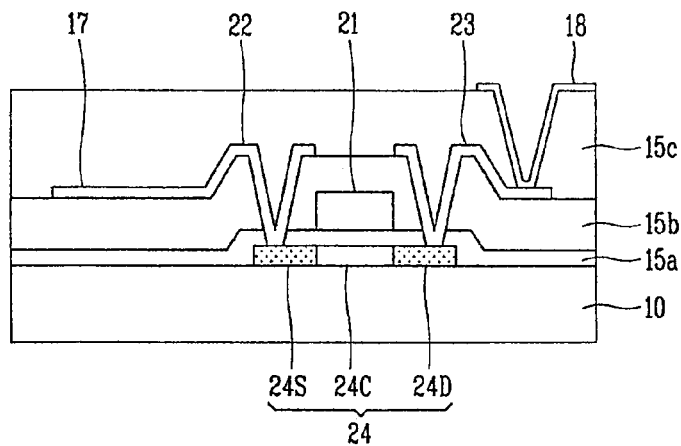
Figure 3A:
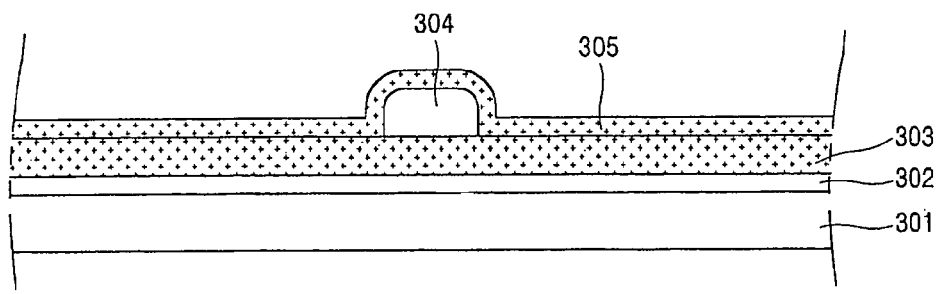
FIGS. 3A to 3F are cross-sectional views showing processes for a method for fabricating a polysilicon liquid crystal display device in accordance with a first embodiment of the present invention.

FIGS. 3A to 3F are cross-sectional views showing processes for a method for fabricating a polysilicon liquid crystal display device in accordance with a first embodiment of the present invention. As shown in FIG. 3A, a buffer layer 302 of silicon oxide ($SiO_2$) or silicon nitride ($SiN_x$) is formed on a substrate 301 to prevent impurities included in the substrate 301 from being diffused into a silicon layer that is to be crystallized, and a first amorphous silicon layer 303 is formed on the buffer layer 302. The first amorphous silicon layer 303 is formed by plasma enhanced chemical vapor deposition (PECVD). After forming the first amorphous silicon layer 303, a photoresist film is applied on the first amorphous silicon layer 303. A photoresist pattern film 304 remains on a channel region after exposure and development.

A second amorphous silicon layer 305 is formed on the photoresist film pattern 304 and the first amorphous silicon layer 305 by PECVD. The second amorphous silicon layer 305 is deposited in a plasma state while mixing high density impurities into the second amorphous silicon layer 305. When a device to be formed is a P-type TFT, ions of a group III elements, such as Boron, can be mixed into the plasma. In the case of a N-type TFT, ions of a group V elements, such as Phosphorous, can be mixed into the plasma.

The second amorphous silicon layer 305 formed by the above method becomes an amorphous silicon layer having impurity ions. The second amorphous silicon layer 305 does not have to be thick and can be formed with a predetermined thickness capable of improving contact characteristics with a metal layer. In this embodiment, the first amorphous silicon layer 303 can have a thickness of about 500 angstroms (Å) and the second amorphous silicon layer 305 can have a thickness of about 200 angstroms (Å).

Next, the photoresist film pattern 304 and a portion of the second amorphous silicon layer 305 formed on the photoresist film pattern are removed at the same time by a lift-off process. In the lift-off process, a thin film existing at an upper portion of the photoresist is taken away in the process of stripping the photoresist pattern 304. In embodiments of the present invention, a channel region 330 is defined by the lift-off process. As a result of the lift-off process, only the first amorphous silicon layer 303 is left on the channel region 330, and a dual layer of the first and second amorphous silicon layers 303 and 305 is left at other regions.

Figure 3B:
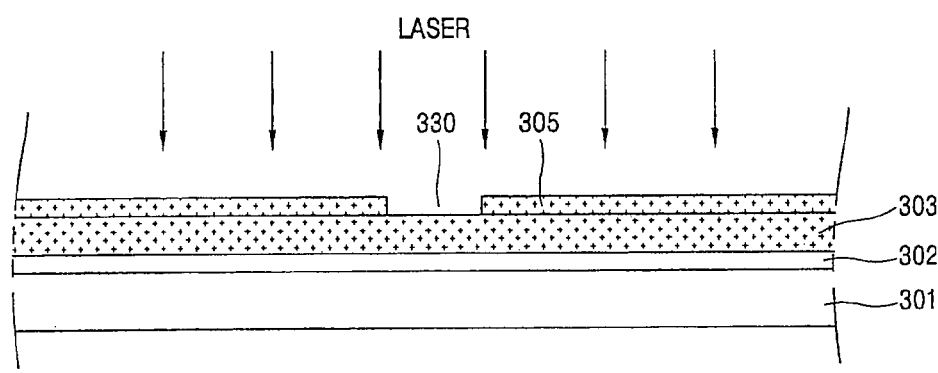

Next, as shown in FIG. 3B, the formed first and second amorphous silicon layers are crystallized. The crystallization process includes a step of performing dehydrogenation by heating the amorphous silicon layers 303 and 305 and a step of crystallizing the amorphous silicon layers. The crystallization process will now be described in detail.

The hydrogen ions function can cause defects during the process of crystallizing amorphous silicon. More particularly, the hydrogen ions are removed in advance because they are likely to explode, which can cause damage a silicon layer in the crystallization process. In order to get rid of hydrogen included within the formed amorphous silicon layers, the amorphous silicon layers are put into a furnace and heated at about 400° C. so as to remove the hydrogen.

After the dehydrogenation process, the process of crystallizing the amorphous silicon layers is performed. An amorphous silicon layer can be heated at a high-temperature furnace. In a laser crystallization method, amorphous silicon layer can be momentarily heated to be crystallized by using excimer laser energy. In the laser crystallization method, a large grain size can be formed in the crystallization process so that electron mobility pan be significantly improved in comparison to the heating method of crystallization. Accordingly, the laser crystallization method is effective when forming a TFT requiring rapid operation.

Figure 3C:
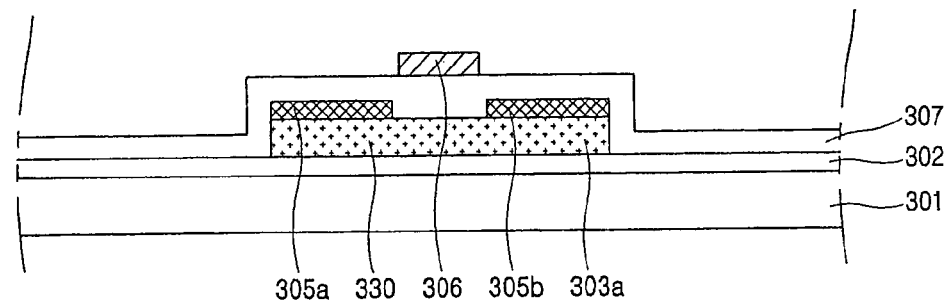

After crystallizing the amorphous silicon layer, as shown in FIG. 3C, the polysilicon layer is patterned into an active layer 303A using a second mask. The process of patterning the active layer may be performed by using photolithography. More particularly, an exposure process, a development process and a process of etching a polysilicon layer are performed using the second mask on the photoresist film, which has been applied on the polysilicon layer. The polysilicon layer can be effectively patterned by dry etching.

Impurity ions included within the second amorphous silicon layer 305 are activated during the process of crystallizing the amorphous silicon layers 303 and 305. This activation allows the impurity ions disposed in a lattice to rearrange themselves into a stable form while the crystallization process is performed. Consequently, this process does not require injecting of impurity ions or a separate activation process to form the active layer 303a including source and drain regions 305a and 305b.

After forming the active layer 303a, as shown in FIG. 3C, a first insulating layer 307 composed of silicon oxide or silicon nitride is formed over the entire surface of the substrate, including the active layer 303 a by PECVD. In addition, a conductive layer is formed on the first insulating layer 307 by sputtering. The conductive layer is for forming a gate electrode. The conductive layer can be aluminum (Al) or molybdenum (Mo). Also, a dual layer of aluminum and molybdenum can be used as the conductive layer. After forming the conductive layer, the conductive layer is patterned to form a gate line (not shown) and a gate electrode 306.

Next, a second insulating layer 308 composed of silicon nitride or -silicon oxide is formed on the gate electrode 306 and the first insulating layer 307. The second insulating layer may be formed by PECVD.

Figure 3D:
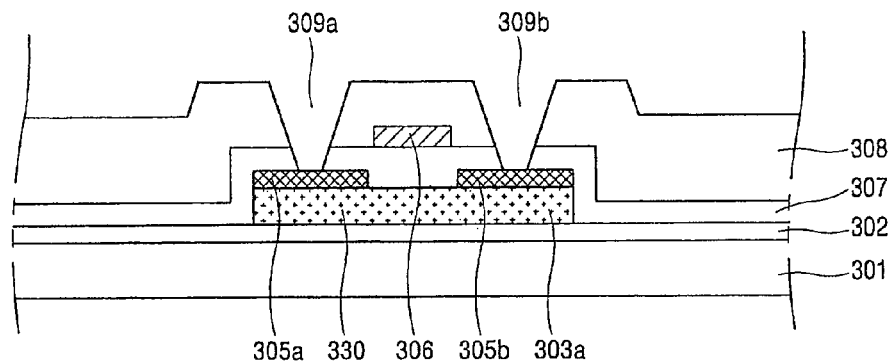

After forming the second insulating layer, as shown in FIG. 3D, contact holes are formed within the second insulating layer 306. The contact holes expose a source region 305aand a drain region 305b. The contact holes include a first contact hole 309a and a second contact hole 309b.

Figure 3E:
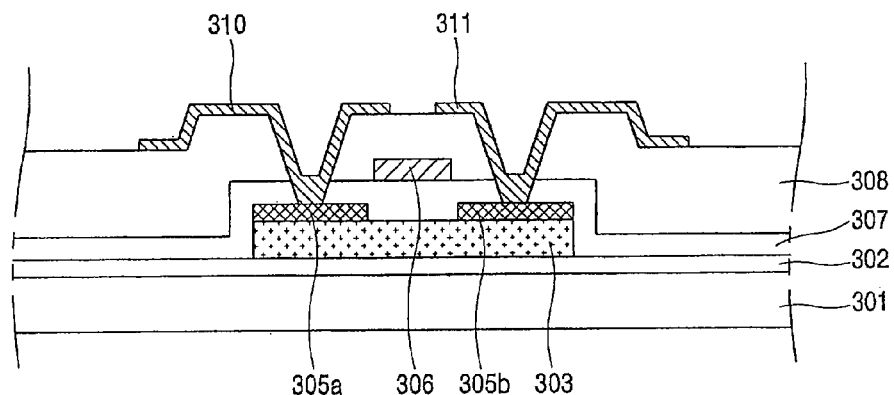
Figure 3F:
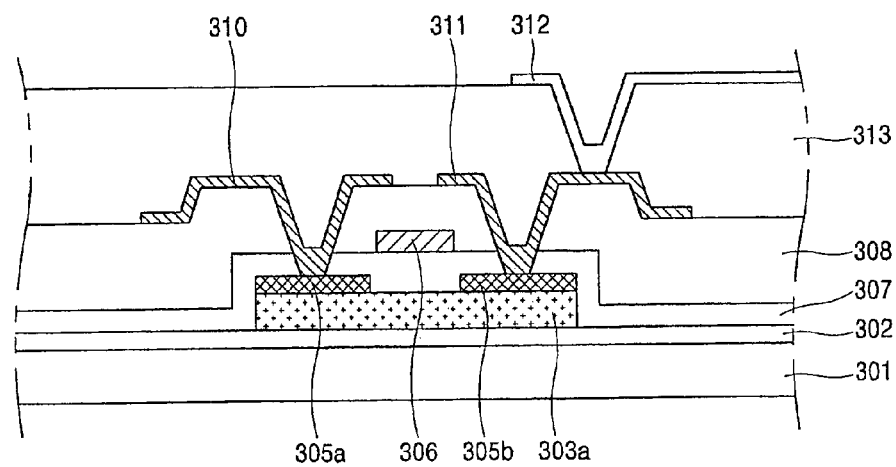

Next, as shown in FIG. 3E, a conductive layer is formed on the second insulating layer 308 on which the first contact hole 309a and the second contact hole 309b are formed, and the conductive layer is patterned to form source and drain electrodes 310 and 311.

Next, a third insulating layer 313 composed of an organic layer or an inorganic layer is formed on the entire surface of the substrate on which the source and drain electrodes are formed. Then, a contact hole for exposing a part of the drain electrode 311 is formed in the third insulating layer 313. A pixel electrode 312 connected to the drain electrode 311 is formed in the contact hole. By the above-mentioned method, a polysilicon display device in accordance with an embodiment of the present invention can be formed without injecting impurity ions to form source and drain electro des or having to perform seperate activation process.

Next, with reference to FIGS. 4A to 4G, a process for fabricating a liquid crystal display device in accordance with another embodiment of the present invention will be described. In particular, in the second embodiment, a process of fabricating a polysilicon display device will be described by a five-mask process using a diffraction exposure method.

Figure 4A:
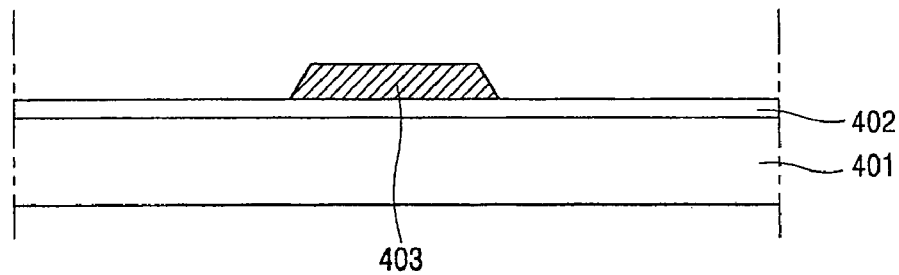
FIGS. 4A to 4G are cross-sectional views showing processes for a method of fabricating a polysilicon liquid crystal display device in accordance with a second embodiment of the present invention.
Figure 4B:
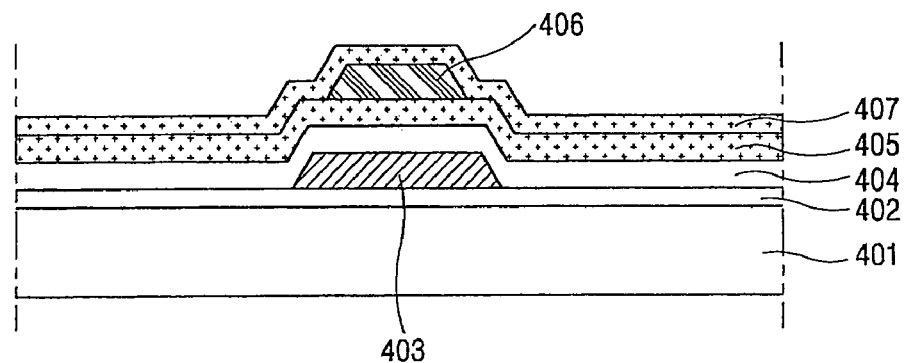

As shown in FIG. 4A, a process for forming a gate electrode 403 on a substrate 401 is performed. Before forming the gate electrode, a buffer layer 402 which may be composed of silicon nitride or silicon oxide is formed on the substrate 401 in order to prevent impurity ions in the substrate from being diffused into a subsequently formed active layer.

Next, a conductive layer, which may be compose of metal, is formed on the buffer layer 402, and the conductive layer is patterned to form a gate electrode 403 and a gate line (not shown).

Next, a first insulating layer 404 composed of silicon oxide or silicon nitride is formed on the substrate on which the gate electrode 403 is formed. Subsequently, a first amorphous silicon layer 405 is formed on the first insulating layer 404.

Next, a photoresist is applied on the first amorphous silicon layer 405 and patterned to form a photoresist pattern 406 on a channel region by using a mask.

Next, a second amorphous silicon layer 407 is formed on the photoresist patterns 406 and the first amorphous silicon layer 405 by PECVD. At this time, the second amorphous silicon layer 407 includes highs density impurity ions. A mixture of the second amorphous silicon and the high density impurity ions may be formed by infusing the high density impurity ions into the chamber while the second amorphous silicon layer 407 is deposited by PECVD. When a P-type TFT is formed, ions of the periodic Group III, such as Boron, may be used as the impurity ions and in the case of a N-type TFT, ions of the Group V such as Phosphorous may be used.

The second amorphous silicon layer 407 formed by the above method inherently becomes an amorphous silicon layer in which the impurity ions are intermixed. At this time, the second amorphous silicon layer 407 does not have to be thick and may be formed with a predetermined thickness capable of improving ohmic contact characteristics with a metal layer. In this embodiment, the first amorphous silicon layer 405 can have a thickness of about 500 angstroms Å and the second amorphous silicon layer 407 can have a thickness of about 200 angstroms Å.

Next, the photoresist pattern 406 and a portion of the second amorphous silicon layer 407 formed on the photoresist pattern are removed at the same time by a lift-off process. The lift-off process is the same as described in the above-mentioned embodiment. By using this lift-off process, only the first amorphous silicon layer 405 is left on the channel region, and other regions have a lamination structure of both the first and second amorphous silicon layers 405 and 407.

Figure 4C:
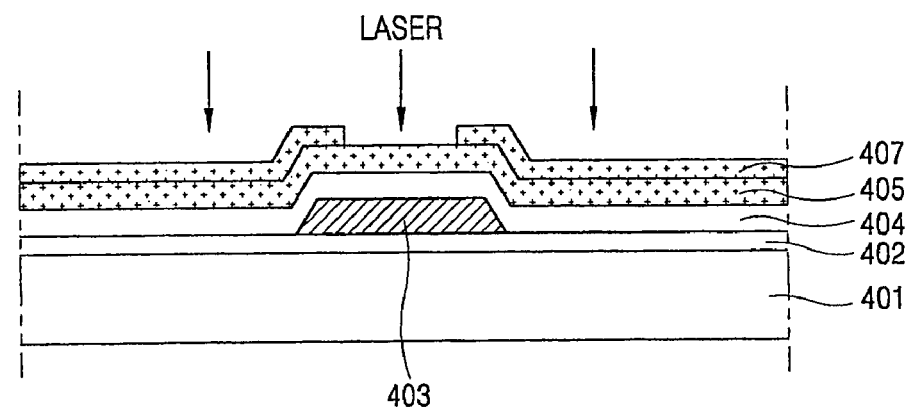
Figure 4D:
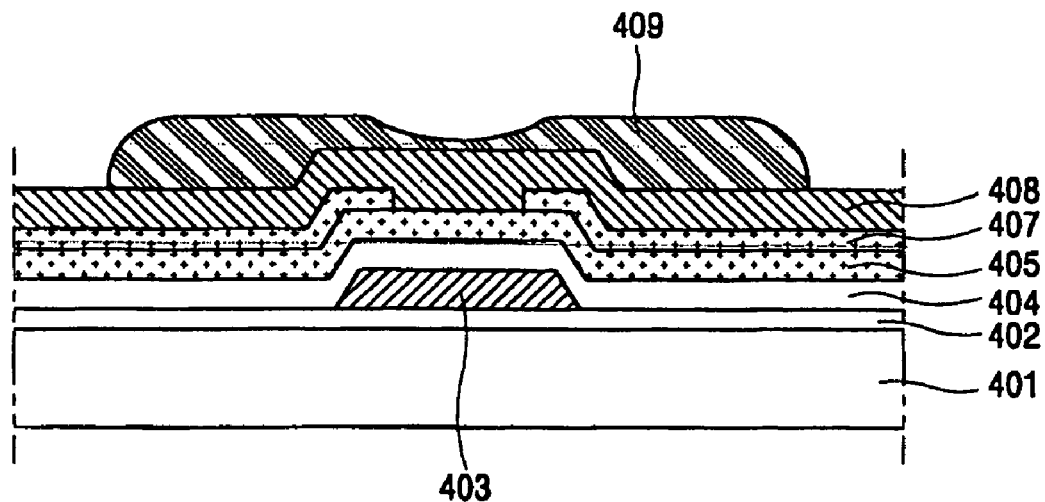

Next, as shown in FIG. 4C, a process of crystallizing the formed first and second amorphous silicon layers is performed. The crystallization process comprises a step of performing dehydrogenation by heating the amorphous silicon layers 405 and 407 and a step of crystallizing the amorphous silicon layers.

Figure 4E:
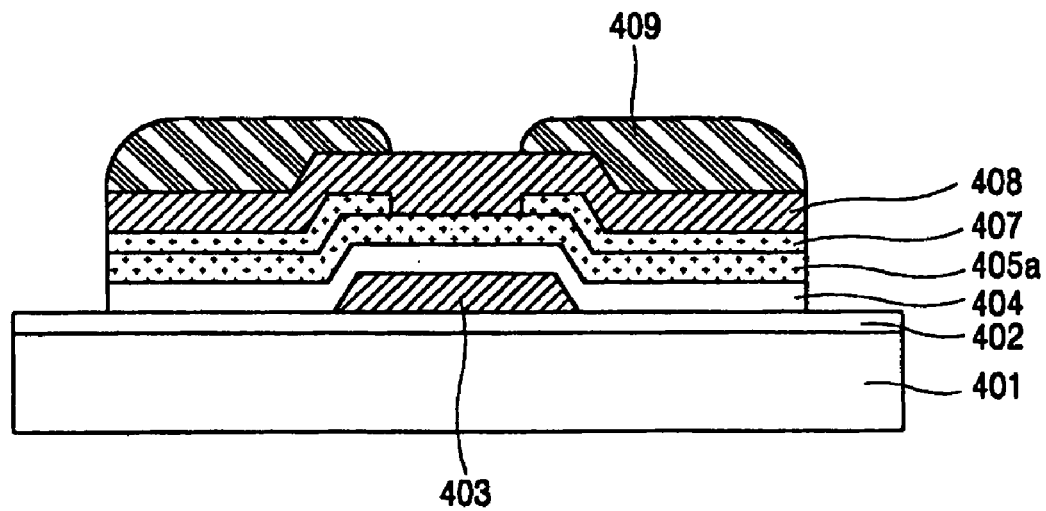

Next, as shown in FIG. 4E, the conductive layer 408, the first silicon layer 405, the second silicon layer 407 and the first insulating layer 404 are removed by an etching process using the slit-exposed photoresist pattern 409 as a mask so as to define an active layer 405a. After patterning the active layer, the photoresist pattern 409 is ashed. As a result of the ashing, the thinner portion of the photoresist pattern 409 on the upper portion of the channel region is removed so that the conductive layer 408 on the channel region is exposed.

When the conductive layer 408 on the channel is exposed, the conductive layer is then etched to expose the active layer 405a under the conductive layer in the channel region. As a result, as shown in FIG. 4F, the conductive layer 408 on the active layer 405a is separated into source and drain electrodes 410 and 411.

Next, the ashed photoresist pattern remaining on the source and drain electrodes 410 an 411 is stripped and a second insulating layer 412, passivation layer, is formed on the source and drain electrodes. The second insulating layer may be an inorganic layer having the same materials as the above-mentioned embodiment.

Figure 4F:
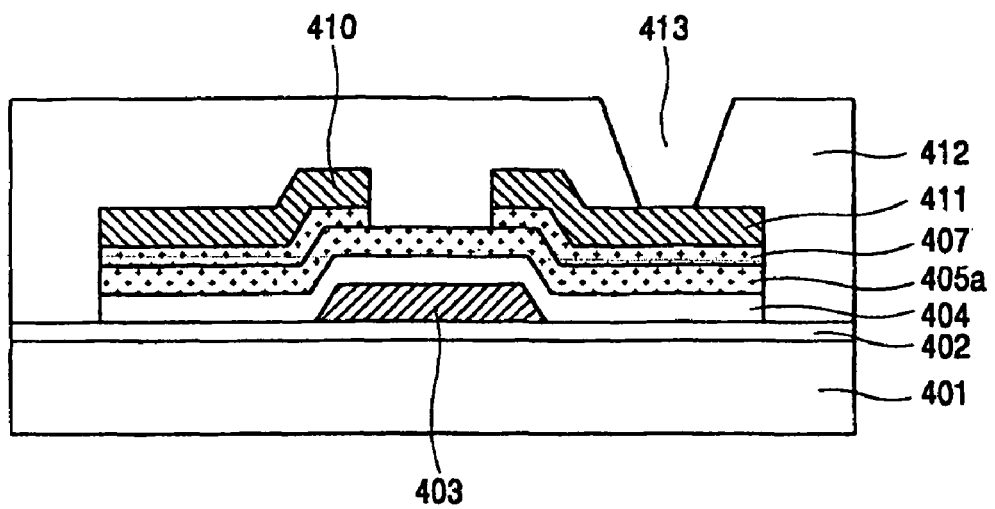

After forming the second insulating layer 412, as shown in FIG. 4F, a contact hole 413 exposing the drain electrode 411 is formed in the second insulating layer.

Figure 4G:
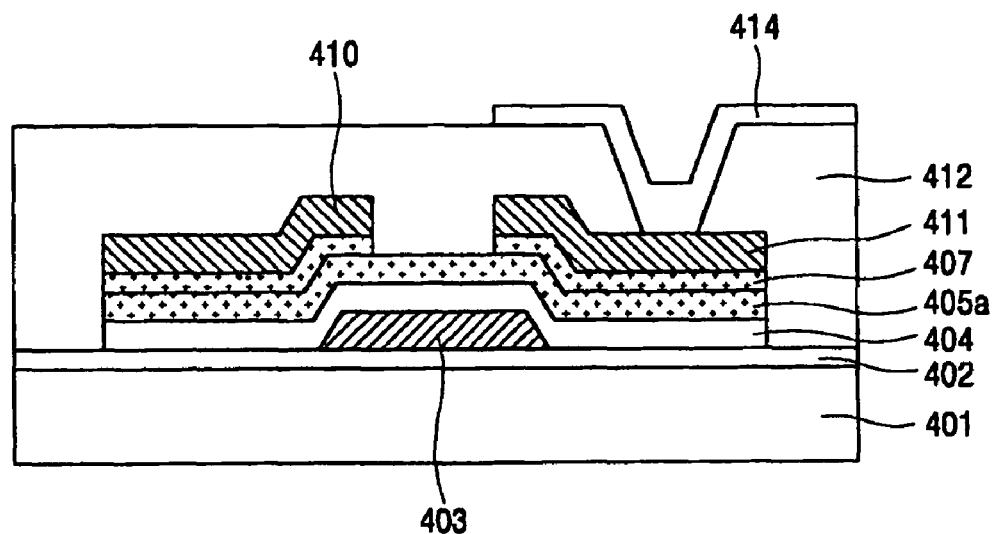

After forming the contact hole 413, as shown in FIG. 4G, a pixel electrode 414 is formed on the second insulating layer 412. As a result, a thin film transistor may be formed through a five-mask process by using a first mask for forming a gate electrode, a second mask for forming a photoresist pattern, a third mask as a slit mask for forming source and drain electrodes, a fourth mask for forming a contact hole on the drain electrode and a fifth mask for forming a pixel electrode.

As so far described, in the present invention, by forming a photoresist pattern on a channel region, forming an amorphous silicon layer on the photoresist pattern in an atmosphere of containing impurity ions, removing the photoresist and the amorphous silicon layer by a lift-off method, and automatically activating the amorphous silicon layer during the crystallization process, a separate ion-injection process does not have to be performed to form drain and source regions. In addition, since there is no need for separately performing a process of activating the amorphous silicon layer into which ions are injected, ion injection equipment and equipment for activating the silicon layer into which ions are injected and the steps may decrease. Accordingly, the number of processes can be reduced.

Since source and drain regions of a liquid crystal display device of the present invention are not formed by an ion injection method, the crystalline lattice of the polysilicon is not damaged. In addition, a process dedicated solely to activation is not performed. Further, source and drain regions composed of the polysilicon layers are of good quality and have improved contact characteristics.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of fabricating a polysilicon liquid crystal display device, comprising:
   forming a gate electrode on a substrate;
   forming a first insulating layer on the gate electrode;
   forming a first amorphous silicon layer on the first insulating layer;
   forming a photoresist on the first amorphous silicon layer;
   patterning the photoresist using a mask to form a photoresist pattern on a channel region of the first amorphous silicon layer, wherein the photoresist pattern has a width smaller than a width of the gate electrode;
   forming a second amorphous silicon layer including high density impurity ions over the photoresist pattern and the first amorphous silicon layer, wherein the second amorphous silicon layer including high density impurity ions is formed by infusing the high density impurity ions into a chamber while the second amorphous silicon layer is deposited by PECVD;
   removing the photoresist pattern and a portion of the second amorphous silicon layer on the photoresist pattern by a lift-off process to define a channel region on the first amorphous silicon layer;
   performing dehydrogenation by heating the first and second amorphous silicon layers to remove hydrogen within the first and second amorphous silicon layers;
   crystallizing the first and second amorphous silicon layers by a laser crystallization process;
   forming a conductive layer on the crystallized first and second silicon layers;
   forming a photoresist film on the conductive layer;
   exposing the photoresist film by a slit mask to form a stepped photoresist pattern having a thinner thickness at an upper portion of the channel region than that at other regions;
   removing the conductive layer, the crystallized first and second silicon layers, and the first insulating layer by an etching process using the stepped photoresist pattern as a mask to define an active layer;
   ashing the stepped photoresist pattern to remove a portion of the stepped photoresist pattern on the channel region to expose a portion of the conductive layer;
   removing an exposed portion of the conductive layer on the crystallized first silicon layer to form source and drain electrodes;
   removing the ashed photoresist pattern t4ae remaining on the source and drain electrodes;
   forming a second insulating layer on the substrate including the source and drain electrodes;
   forming a contact hole exposing the drain electrode in the second insulating layer; and
   forming a pixel electrode on the second insulating layer and electrically connected to the drain electrode through the contact hole.

2. The method of claim 1, wherein the high density impurity ions includes Group III or Group V type ions.

3. The method of claim 1, wherein in the performing dehydrogenation, the substrate having the first and second amorphous layers is put into a furnace and heated at about 400° C. so as to remove the hydrogen.

4. A method of fabricating a polysilicon liquid crystal display device, comprising:
   forming a buffer layer on a substrate;
   forming a gate electrode on the buffer layer;
   forming a first insulating layer on the gate electrode;
   forming a first amorphous silicon layer on the first insulating layer;
   forming a photoresist on the first amorphous silicon layer;
   patterning the photoresist using a mask to form a photoresist pattern on a channel region of the first amorphous silicon layer, wherein the photoresist pattern has a width smaller than a width of the gate electrode;
   forming a second amorphous silicon layer including high density impurity ions over the photoresist pattern and the first amorphous silicon layer, wherein the second amorphous silicon layer including high density impurity ions is formed by infusing the high density impurity ions into a chamber while the second amorphous silicon layer is deposited by PECVD and wherein the high density impurity ions includes Group III or Group V type ions;
   removing the photoresist pattern and a portion of the second amorphous silicon layer on the photoresist pattern by a lift-off process to define a channel region on the first amorphous silicon layer;
   performing dehydrogenation by heating the first and second amorphous silicon layers to remove hydrogen within the first and second amorphous silicon layers, wherein in the performing dehydrogenation, the substrate having the first and second amorphous silicon layer is put into a furnace and heated at about 400 degrees C. so as to remove the hydrogen;
   crystallizing the first and second amorphous silicon layers by a laser crystallization process;
   forming a conductive layer on the crystallized first and second silicon layers;
   forming a photoresist film on the conductive layer;
   exposing the photoresist film by a slit mask to form a stepped photoresist pattern having a thinner thickness at an upper portion of the channel region than that at other regions;
   removing the conductive layer, the crystallized first and second silicon layers, and the first insulating layer by an etching process using the stepped photoresist pattern as a mask to define an active layer;
   ashing the stepped photoresist pattern to remove a portion of the stepped photoresist pattern on the channel region to expose a portion of the conductive layer;
   removing the conductive layer on the crystallized first silicon layer to form source and drain electrodes;
   removing the ashed photoresist pattern remaining on the source and drain electrodes;
   forming a second insulating layer on the substrate including the source and drain electrodes;
   forming a contact hole exposing the drain electrode in the second insulating layer; and
   forming a pixel electrode on the second insulating layer and electrically connected to the drain electrode through the contact hole.

* * * * *